United States Patent [19]

Bayruns et al.

[11] Patent Number: 4,691,331
[45] Date of Patent: Sep. 1, 1987

[54] SELF-CORRECTING FREQUENCY DIVIDERS

[75] Inventors: Robert J. Bayruns, Middlesex; Harry T. Weston, New Providence, both of N.J.

[73] Assignee: American Telephone and Telegraph Company, AT&T Bell Laboratories, Murray Hill, N.J.

[21] Appl. No.: 935,170

[22] Filed: Nov. 25, 1986

Related U.S. Application Data

[63] Continuation-in-part of Ser. No. 665,986, Oct. 29, 1984.

[51] Int. Cl.⁴ .................. H03K 21/00; H03K 23/40
[52] U.S. Cl. ........................................ 377/47; 377/28; 328/15
[58] Field of Search .............. 377/28, 64, 68, 70, 377/72, 74, 104, 105, 118, 119, 121, 55, 73, 75, 47, 111, 114, 48; 328/63, 105, 15; 307/262, 480, 606, 445, 446

[56] References Cited

U.S. PATENT DOCUMENTS

| | | | |
|---|---|---|---|
| 3,601,636 | 8/1971 | Marsh, Jr. .................. | 307/445 X |
| 3,609,391 | 9/1971 | Hatano et al. ............... | 377/45 X |
| 3,930,169 | 12/1975 | Kuhn, Jr. .................... | 377/105 X |
| 3,992,635 | 11/1976 | Suzuki et al. ................ | 377/74 X |
| 4,103,251 | 7/1978 | Glick .......................... | 307/445 X |
| 4,134,073 | 1/1979 | MacGregor ................. | 307/606 X |
| 4,216,391 | 8/1980 | Gehrig et al. ................ | 377/74 |
| 4,241,418 | 12/1980 | Stanley ....................... | 328/72 X |
| 4,423,383 | 12/1983 | Svendsen .................... | 328/63 |
| 4,606,059 | 8/1986 | Oida ........................... | 377/72 X |

FOREIGN PATENT DOCUMENTS 54090  3/1984  Japan .................. 377/28

OTHER PUBLICATIONS

"AT&T Announces Highest Capacity Lightwave System", *AT&T News Release*, 1984, pp. 1–4.

Primary Examiner—John S. Heyman
Assistant Examiner—K. Ohralik
Attorney, Agent, or Firm—David I. Caplan

[57] ABSTRACT

A frequency divider for converting an n-bit periodic counting stream (each period containing a single zero or one bit, respectively, followed by n−1 one or zero bits) into a 2n-bit counting stream includes a two-input NOR gate or NAND gate, respectively, connected for delivering its output to an n-bit delay device, the NOR or NAND gate further connected for receiving the output of the delay device as feedback at one of its two-input terminals and for receiving the n-bit counting stream at the other of its two-input terminals. The output of the delay device is then a 2n-bit counting stream.

24 Claims, 10 Drawing Figures

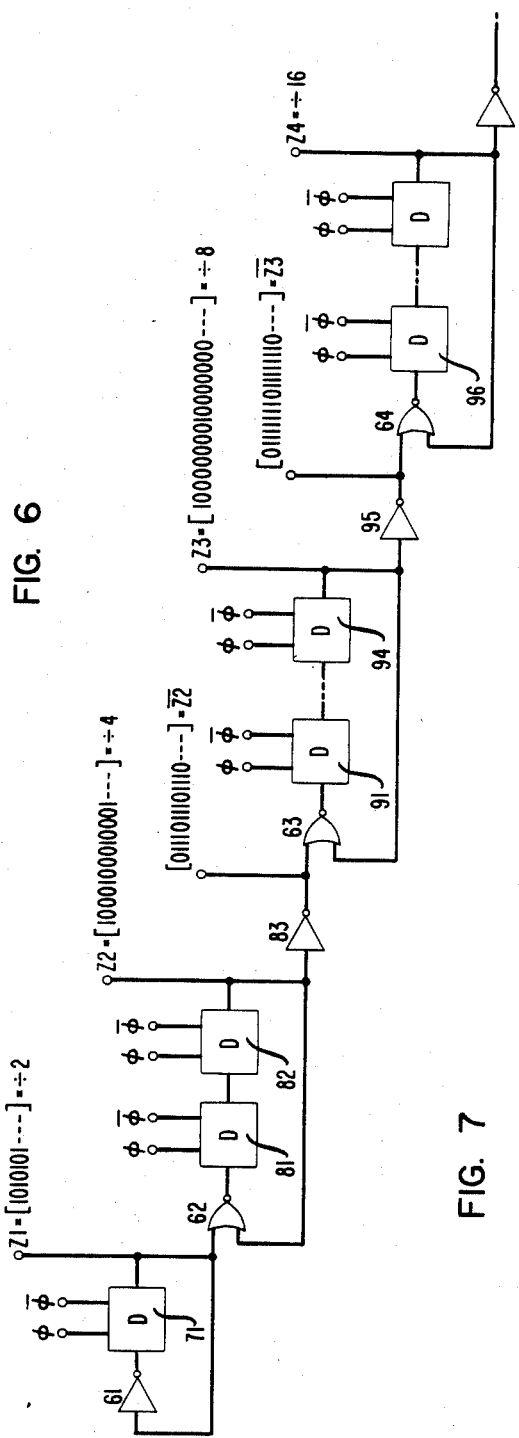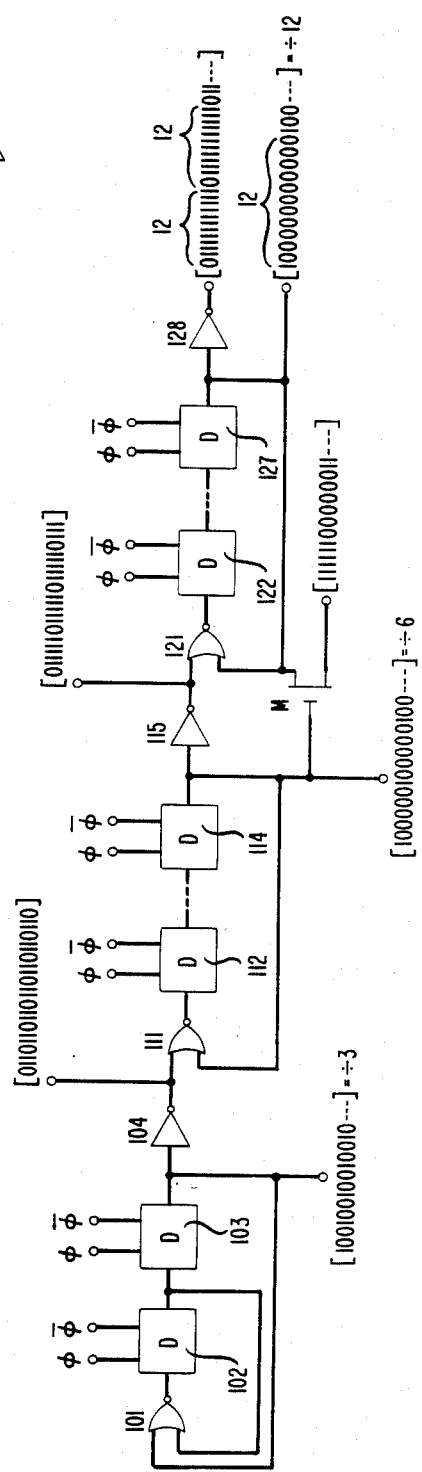
FIG. 6
FIG. 7

SELF-CORRECTING FREQUENCY DIVIDERS

This application is a continuation-in-part of application Ser. No. 665,986 filed Oct. 29, 1984

FIELD OF THE INVENTION

This invention relates to frequency divider circuits and more particularly to frequency divider circuits which are self-correcting (self-initializing) and thus do not require initialization or reset. Such circuits are useful, for example, for supplying the control timing for either the multiplexing or the demultiplexing of data streams.

BACKGROUND OF THE INVENTION

Present-day and presently proposed fiber optics systems transmit information in the form of binary data streams from a sender through an optical fiber transission channel to a receiver at data rates or frequencies of the order to gigabits ($10^9$ bits) per second as projected by circuit simulation techniques. A data stream is a sequence of pulses, each of the pulses being developed by the sender within a separate preassigned time slot, and the amplitude or height of each such pulse typically representing a separate piece of information--typically a "bit" (binary digit) of data, in binary logic. Each such bit accordingly is valid only within the separate corresponding time slot. For orderly synchronous transmission, each such time slot has a duration equal to a period or cycle of a clock control timer (typically a clock pulse sequence).

In such systems, frequency divider circuits (i.e., circuits for reducing by an integral factor the frequency of electrical clock pulses) are particularly useful for supplying electrical timing control required for multiplexing (or demultiplexing) the data streams supplied to (or by) the optical fiber. By "multiplexing" is typically meant, for example, the process of delivering into a single common transmission channel during separate time slots the data coming from a multiplicity, say n, of separate individual channels; so that, for example, in binary digital transmission the single common channel propagates in sequence, say one piece or bit of data from the first individual channel, followed by one bit from the second individual channel, . . . , followed by one bit from the n'th individual channel, followed by one new bit from the first individual channel, etc. (i.e., repeating the cycle of one bit in succession from each individual channel). The result is thus n-fold multiplexing of data into the common channel from the individual channels. Such multiplexing is known as "time division multiplexing," and can also be used in conjunction with sampled analog transmission, as known in the art (but will not be discussed further, only for the sake of simplicity). By "demultiplexing" is meant the opposite process, that is, of sequentially delivering the data propagating in the common channel into the multiplicity of n channels; so that, for example, the first bit in the common channel is delivered to the first channel, the second bit is delivered to the second channel, . . . , the n'th bit is delivered to the n'th channel, the (n+1)'th bit is delivered to the first channel, etc. The result here is thus n-fold demultiplexing of data from the common channel into the individual channels. Typically, multiplexing is performed at the sender, while demultiplexing is performed at the receiver, and the data propagates in the common channel from sender to receiver.

FIG. 1 shows a prior art circuit arrangement for multiplexing at a sender, for example, a multiplicity n of different data bit streams—each stream propagating in a separate one of a multiplicity n of separate individual incoming channels Ch1, Ch2, . . . Chn—into a single common outgoing channel Ch0. Assume for definiteness that the bit rate in each of the individual incoming channels Ch 1, Ch2, . . . Chn is given by f/n bits per second, and hence that the bit rate in the common channel Ch0 is f bits per second. To accomplish the desired multiplexing, each stage of an n-stage serial shift register (i.e., n successive clocked latches which impart delays D1, D2, . . . Dn, respectively, to data circulating in the register) has its timing for reception and delivery of data controlled by the same clock pulse sequence $\phi$. Each stage imparts the same delay $D=D1=D2= \ldots Dn$ to the data circulating through the register synchronously with the flow of data in the channel Ch0, i.e., such that $D=1/f$. The register is arranged and operated as a "ring counter", that is, with the n'th (last) stage of the register connected for feeding back its output as input to the first stage of the register, each stage being initialized as described below. Typically, each stage of the serial register is a master-slave latch controlled by a two-phase clock control timing pulse sequence $\phi$ having a period $T=1/f$, for controlling the timing of reception and delivery of new data to and from each stage. Thus, the delay D of each stage is equal to the period T of the sequence $\phi$, as known in the art. During operation, the register must be properly initialized, i.e., by setting one and only one of the stages with a one bit and resetting every other stage with a zero bit. As time progresses during operation, the one bit moves from its original position through the shift register to the last (n'th) stage, then (through a feedback line F) to the first stage, and then again through the register to the last stage, etc., whereby during any single clock period (cycle) every stage of the register contains a zero bit except for a single stage that contains the one bit. By the time the single one bit thus circulates through the register back to its original position, say the i'th stage, the i'th channel Chi presents its next new bit of data. Each of an array of n separate input transmission gates in the form of pass transistors T1, T2, . . . Tn (each typically an enhancement mode MOS transistor) is connected for sensing at its input control (gate) terminal the bit which is instantaneously the content and hence output of a separate one of the shift register stages, and each transmission gate is further connected for delivering the data bit in the corresponding incoming channel to the common channel Ch0. Thereby, the shift register supplies control timing for turning on and off each transmission gate, whereby each transmission gate is turned on by a one bit and off by a zero bit supplied by and delivered from the corresponding shift register stage, and thus each transmission gate delivers the instantaneous data bit in the corresponding channel Ch1 . . . Chn to the common channel Ch0 in response to the one bit. Thus, since only a single one bit circulates in the entire register, only one transmission gate can be on at a time, so that only one data bit is delivered to the common channel Ch0 at a time, that is, a data bit from the individual one of the channels Ch1, Ch2, . . . Chn which is connected to that one of the input pass transistors T1, T2, . . . Tn, which is on.

Accordingly, as the single one bit successively shifts from one stage to the next through the n stages of the shift register, the pass transistors T1, T2, . . . Tn are successively turned on, one after the other, whereby the data coming in on the channels Ch1, Ch2, ... Chn is transmitted (multiplexed) onto the common outgoing channel Ch0 in a succession of a bit of data from one channel after another, as is desired in the case of multiplexing the channels Ch1, Ch2, ... Chn onto the channel Ch0. The multiplexer arrangment shown in FIG. 1 is also known as a "parallel-to-serial" converter, since it converts n parallel input data streams propagating from the channels Ch1, Ch2, ... Chn into a single stream propagating in the common channel Ch0. In this common channel, one bit of data from each of the n streams thus flows serially after the other. Note that the resulting data stream flowing in the channel Ch0 automatically has a bit rate equal to f, that is, a bit rate equal to n times the bit rate (f/n) of each of the data streams flowing in the individual channels Ch1, Ch2, ... Chn. Note also that the frequency at which the single one bit reappears in any given stage of the shift register is equal to $f/n = f \div n$,, and thus the n-stage shift register connected and operated as a ring counter performs a frequency division of the clock pulse sequence $\phi$, the frequency of the sequence $\phi$ being equal to $1/T = f$.

After transmitting the multiplexed signal in the transmission channel Ch0 from sender to receiver, demultiplexing (serial-to-parallel conversion) of the incoming multiplexed channel Ch0 at the receiver into (demultiplexed) channels Ch1, Ch2, ... Chn can be performed (FIG. 2) in accordance with prior art by delivering the data from the multiplexed incoming channel Ch0 through a multiplicity n of separate Sample and Hold circuits (S&H)1, (S&H)2, ... (S&H)n. Each of these Sample and Hold circuits has a separate sampling transmission gate T1, T2, ... Tn which is controlled by a separate bit from an n-bit serial shift register to which the counting stream is delivered as input. The Sample function of each Sample and Hold circuit is activated by a one bit; the Hold function, by a zero bit. Input pass transistors T1, T2, ... Tn of the Sample and Hold circuits (S&H)1, (S&H)2, ... (S&H)n in the demultiplexing scheme shown in FIG. 2 are controlled as to their respective timing (on versus off) by a serial shift register in the same manner as the input pass transistors T1, T2, ... Tn in the multiplexing circuit shown in FIG. 1, that is, by a (properly initialized) ring counter of n stages, whereby the channel Ch0 is demultiplexed (serial-to-parallel) onto the individual chanenls Ch1, Ch2, ... Chn.

Note that the use in the n-fold demultiplexer of pass transistors clocked by an n-bit counting stream is preferred over the use of edge-triggered flip-flops clocked by a square wave propagating along a delay line because of the undesirable added gate delays in the response of the flip-flops ("set-up time" delay for edge-triggered latches).

Not also that each of the n-stage shift registers connected and operated as ring counters in FIGS. 1 and 2 supplies to each stage of each register a periodic data stream, each period having a total of n bits characterized by a single one bit and (n−1) zero bits. The time between arrivals at any given stage of successive one bits (in consecutive periods) is thus nT, and the frequency of such arrivals of successive one bits is thus $f/n = f \div n$. Accordingly, the ring counters operate as frequency dividers. In particular, each n-stage register as a ring counter supplies a data stream of bits at the input end of the respective first stage (same as output end of last stage) thereof which is a periodic sequence having a period of n bits in length, each period having a time duration equal to nT and being composed of a single one bit followed by a succession of (n−1) zero bits. Thus, as shown in FIG. 3, equivalent operation can be achieved without the feedback: the feedback can thus be removed—i.e., the output of the last (n'th) stage of the shift register is not fed back to the first stage but is delivered only to the gate terminal of the n'th transmission gate Tn—and, instead of the feedback, the input stage of the n-stage shift register can be supplied with an input periodic stream of bits also having a period of n bits, in length (nT in time), each such period also being composed of a single one bit followed by a succession of (n−1) zero bits. This periodic data stream can thus be represented symbolically as the stream [1000 ... 0001000 ... 0001000 ... ]. Here, each of the triple dots represents a sequence of consecutive zeros in sufficient number (n−7) to make the distance between successive one bits equal to the period n. Thus, this particular stream also has a period between successive one bits equal to n measured in bits (nT measured in time). Such a periodic bit stream can be viewed (upon Fourier analysis, for example) as a frequency divided sequence having a repetition rate or frequency equal to 1/n ("divide by n"), which can also be denoted as a periodic counting-bit stream of periodicity n ("modulo n") or simply as an n-bit countinggn stream. The n-bit counting stream (of periodicity n) is thus equivalent to a frequency division by n. In general, such an n-bit counting stream can be any periodic binary (i.e., two-level) digital signal, each period having a plurality of time slots n in number, the signal carried by one of such time slots in each period being of one level, and the signal carried by the other (n−1) slots in each period being of the other level. Thus, in addition to the n-bit counting stream [1000 ... 0001000 ... 0001000 ... ], where each period of n bits in length consists of a single one (high level) bit followed by (n−1) zero (low level) bits, we have (by inversion) the inverted (i.e., complementary) n-bit counting stream [0111 ... 1110111 ... 1110111 ... ], where each period of n bits consists of a single zero bit followed by (n−1) one bits. Both such periodic streams will be referred to simply as counting streams. In either case, however, it is important for the counting stream to be synchronous with the clock $\phi$—that is, for successive bits in the counting stream to be valid at the shift register during successive time slots corresponding to (portions of) successive periods of the clock $\phi$ when the register can accept successive new data. Thus, the process of multiplexing (or demultiplexing) for n channels requires a counting stream of periodicity n as input to an n-stage shift register each of whose stages controls the timing (on versus off) of a separate transmission gate or switching element, such as a transistor (or a Sample and Hold Circuit), connected between a common channel and a separate individual channel.

A problem with the n-stage shift registers arranged with feedback as a ring counter (FIGS. 1-2) is that—in addition to the requirement for initializing the register by setting a single stage with a one bit and resetting every other stage with a zero bit—the register should be repeatedly re-initialized, owing to the random errors or false bits, which can arise and thereafter continually circulate in the ring counter during operation. That is, whenever an error occurs in the register, the need arises to correct the error, as by again setting (with a one bit) a single stage and resetting (with a zero bit) every other stage; otherwise, the error would undesirably persist.

Thus, after a false bit occurs in a ring counter but before re-initializing, the counter will supply false control signals to the input pass transistors T1, T2, . . . Tn, whereby false multiplexing (or demultiplexing) undesirably occurs. Moreover, detection of the occurrence of false bits in, and re-initialization of, the counter would require undesirable extra circuitry and hence added cost.

Likewise, in a ring counter having an inverter in the feedback loop—called a "switchtail" or Johnson counter—during proper operation the n shift registers in the counter should attain (in sequence) only 2n different states out of the possible $2^n$ different states attainable by n shift registers, a state being defined as a specific configuration of 0's and 1's in the registers. During operation, therefore, 2n states are "proper", whereas the remaining $(2^n - 2n)$ states are "improper". If such a counter were intialized or were otherwise put in any one of the $(2^n - 2n)$ improper states during operation, the counter would never get back (unless a felicitous further error occurs) into any one of the 2n proper states. Thus, if through error during operation such a counter attains any of the $(2^n - 2n)$ improper states, such error must be detected and the counter must be re-initialized—all of which would require undesirable extra circuitry.

In prior art, a frequency dividing circuit which is self-initializing (self-correcting) to avoid the need for such extra circuitry has been furnished by the arrangement shown in FIG. 4. Here, an n-stage shift register is formed by a succession of shift register stages formed by a succession of master-slave ($\phi_1\phi_2$) clocked latches 31, 32, 33, 34, . . . 3n, each controlled by first and second phase clock pulse sequences $\phi_1$ and $\phi_2$. Each such latch thereby forms a separate stage for imposing an (equal) associated delay D1=D2= . . . =Dn(=D) upon the signal propagating from left to right, the output of each such stage being fed back through a separate feedback line, F1, F2, F3, F4, . . . Fn, as input to an n-input NOR gate 41. Thereby, the output—divide by (n+1) or ÷(n+1)—of the arrangement is delivered to an ouput terminal 45 in the form of a counting stream of periodicity (n+1)—i.e., a periodic bit stream in which each period of bits consists of a single one bit followed by n zero bits. Note that the latches in all stages again are all clocked by the same master-slave control timing sequence ($\phi_1\phi_2$) having a periodicity again equal to T, as known in the art, so that the successive time slots of successive bits in the bit stream are also spaced in time by the period T of the sequence ($\phi_1\phi_2$). The NOR gate 41 operates to deliver a zero bit to the first register stage 31 during every cycle of the clock unless and until all inputs to the NOR gate 41 are zero—i.e., unless and until every stage stores a zero bit. Thus, when and only when every stage finally stores a zero, the NOR gate 41 finally delivers a one bit. In this way, the output terminal 45 then delivers the desired output sequence in the form of a succession of n zero bits followed by a single one bit, and thereafter likewise another succession of n zero bits followed by a single one bit, etc. Note that if at any time an error in the form of a spurious one (or zero) bit is developed in any stage of the register, nevertheless, after at most n cycles of the clock the error will have been corrected by the NOR gate 41 and the desired output sequence will have resumed. A multiple input NOR gate, i.e., the n-input NOR gate 41, however, requires in NMOS technology, for example, an array of n similar N-channel transistors mutually connected in parallel, and such an array for n greater than 2 or 3 causes undesirably slow operation due to the undesirably high parasitic capacitance and hence parasitic RC delay produced by the required n similar transistors in parallel (i.e., about n times the delay of each transistor). In PMOS and CMOS technologies, the multiple input NOR gate requires a chain of n similar P-channel transistors connected in series, and such an array for n greater than 2 or 3 also causes slow operation due to the undesirably high RC parasitics in such a chain.

It should be noted that the NOR gate 41 can be replaced with a multiple input NAND gate, in which case the resulting circulating counting stream will be the complement (inverse) of that circulating in the arrangement shown in FIG. 4.

In U. S. Pat. No. 3,609,391, issued to I. Hatano et al on Sept. 28, 1971 entitled "Timing Pulse Generator," a self-correcting frequency divider circuit is disclosed. However, in addition to requiring (slower) triple-input NOR gates, the circuit also requires AND gates that fan out, that is, AND gates each of whose outputs is required to drive a plurality of (to wit, four) shift register stages. Thus, means for amplifying (boosting) each of the outputs of the AND gates is needed, whereby undesirably further slower operation results. Therefore, it would be desirable to have a self-correcting frequency divider circuit that avoids these shortcomings of the prior art.

SUMMARY OF THE INVENTION

This invention involves a self-correcting frequency divider circuit for converting an n-bit counting stream having a period equal to nT into a 2n-bit counting stream having a period equal to 2nT, where n is any integer greater than unity. In one embodiment of the invention, the n-bit counting stream is delivered as input to one input terminal of a two-input NOR gate. The output terminal of the NOR gate is directly connected to the input terminal of a delay device whose output terminal is directly connected (as feedback) to the other input terminal of the NOR gate. The delay device is constructed so as to delay the data stream emanating at the output terminal of the NOR gate by an amount of time equal to nT. In this way, the output terminal of the delay device develops the desired 2n-bit counting stream of period 2nT (i.e., frequency divided by 2). This 2n-bit counting stream can then be delivered to a utilization means for using the control timing corresponding to the 2n-bit stream, such as 2n-fold multiplexing or demultiplexing circuit. By cascading first and second successive frequency dividing circuits (the output of the first being an input of the second)—the first for converting an n-bit to a 2n-bit counting stream, the second for converting a 2n-bit to a 4n-bit counting stream—an n-bit counting stream of period T can be converted into a 4n-bit counting stream of period 4T.

As used herein, the term "NOR gate" in the context of being directly connected to a delay device should be understood to include functional logical equivalents—such as an OR gate in the context of being directly connected to an inverting delay device, i.e., a delay device that has the property of inverting the data stream flowing through it.

In another embodiment of the invention instead of the two-input NOR gate, a two-input NAND gate is used in conjunction with a counting stream which is available as an input in the form of the inverse (i.e., complement)

of the counting stream used in the previously described embodiment with the NOR gate. In this way, no added inverter is required to invert either of the inputs of the two-input gate.

In a specific embodiment, the delay device is formed by an n-stage shift register, each stage being a pair of transistors connected in series and timed in a master-slave relationship by means of a two-phase clock pulse sequency having the same periodicity as that of the duration of each time slot of the input n-bit counting stream. Thus, the timing of each stage of the shift register is synchronous with the timing of the n-bit counting stream. The resulting output of the delay device—i.e., the resulting output of the frequency divider—is connected as input to a 2n-stage serial shift register which, in turn, is clocked synchronously with the counting stream, the output of each stage being connected for control timing of a corresponding one of each transmission gate in an array of 2n transmission gates arranged for 2n-fold multiplexing or demultiplexing of data channels. Moreover, there are at most two inverter delays between any two successive pass transistors along the data path of the shift register, in order to enable high speed of operation, that is, to enable a bit rate of about 2 gigabits per second as projected by circuit simulation techniques.

BRIEF DESCRIPTION OF THE DRAWING

This invention together with its features, advantages, and characteristics may be better understood from the following detailed description when read in conjunction with the drawing in which:

FIGS. 6–9 show portions of self-correcting frequency dividers in accordance with various illustrative specific embodiments of the invention.

All transistors shown are typically n-channel MOS (metal oxide semiconductor) transistors, i.e., NMOS technology. Each inverter symbol represents a conventional NMOS inverter formed by an enhancement mode transistor (driver) connected in series with a depletion mode transistor (load) between ground and a power line ($V_{DD}$).

DETAILED DESCRIPTION

Figure 5:
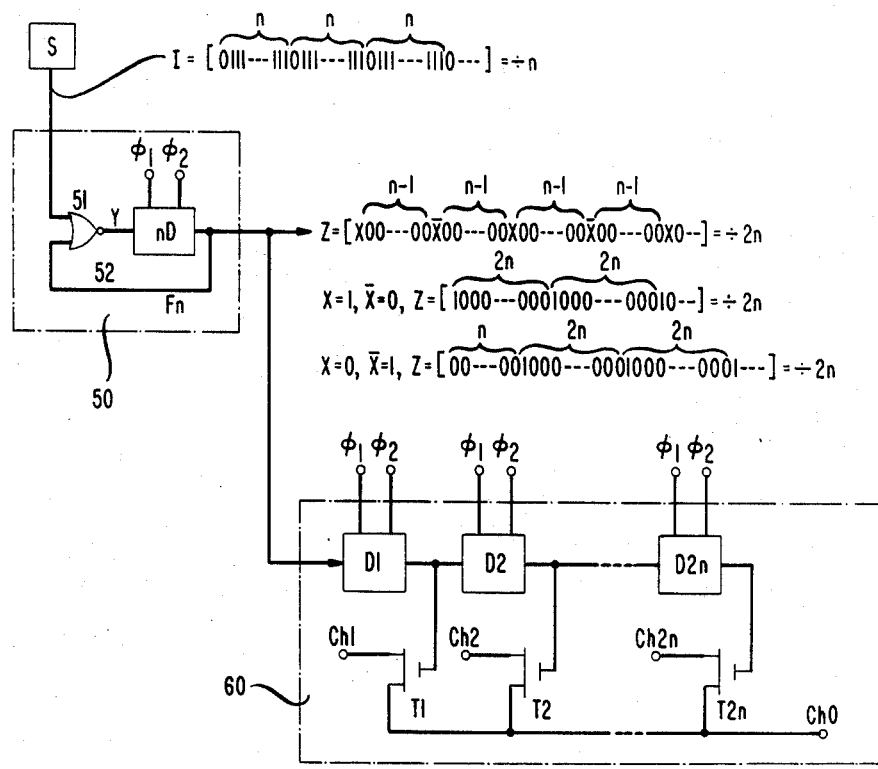
FIG. 5 shows a self-correcting frequency divider in accordance with the invention, used in a multiplexing circuit.

FIG. 5 shows a self-correcting frequency divider 50 which converts an input n-bit counting stream I supplied by a source S into an output 2n-bit counting stream Z. This stream Z, in turn, controls a multiplexer 60 comprising a 2n-stage serial shift register (i.e., having 2n master-slave stages denoted by D1, D2, ... D2n), each stage timed by the same clock control timing sequence $\phi$ which is synchronous with the tiing of the counting stream I, whereby data in the shift register are shifted from every stage (except for the last) to the next succeeding stage during each clock period T of the sequence $\phi$, each such clock period being synchronous with a corresponding time slot of the counting stream I during each of which a different corresponding bit of the stream I is valid at the register. Thus, each stage delays the counting stream I by an amount of time $D=T=1/f$, where f is the bit rate of the counting stream I.

The frequency divider 50 includes a two-input NOR gate 51 and a delay device 52. The NOR gate is connected for delivering its output data Y as input data to the delay device. The delay device 52 is constructed so as to delay the data propagating through it by an amount of time equal to nD, that is, n times the period $T=1/f$ associated with the duration of one time slot of the counting stream I. One of the input terminals of the NOR gate 51 is connected for receiving the counting stream I, and the other of the input terminals of the NOR gate 51 is connected for receiving as feedback Fn the output Z of the delay device 52. The output Z is a 2n-bit counting stream.

The multiplexer 60 is constructed and operates in the same way as in prior art (FIG. 3), and has a 2n-stage serial shift register which is connected for receiving the 2n-bit counting stream Z, whereby the multiplexer 60 can perform 2n-fold multiplexing. The output Z can also be delivered as a 2n-bit counting stream to another frequency divider (not shown) similar to the divider 50 except that instead of a delay device 52 with a delay of nD it now has a delay device with a delay of 2nD.

Figure 1:
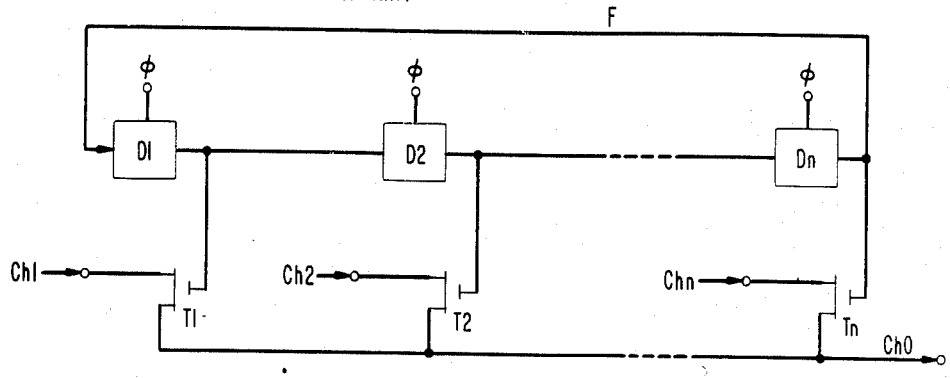
FIG. 1 shows a data multiplexing scheme in accordance with prior art.
Figure 2:
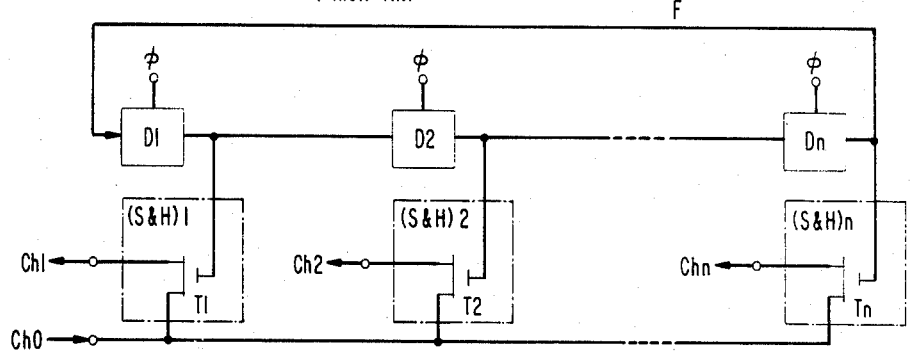
FIG. 2 shows a data demultiplexing scheme in accordance with prior art.
Figure 3:
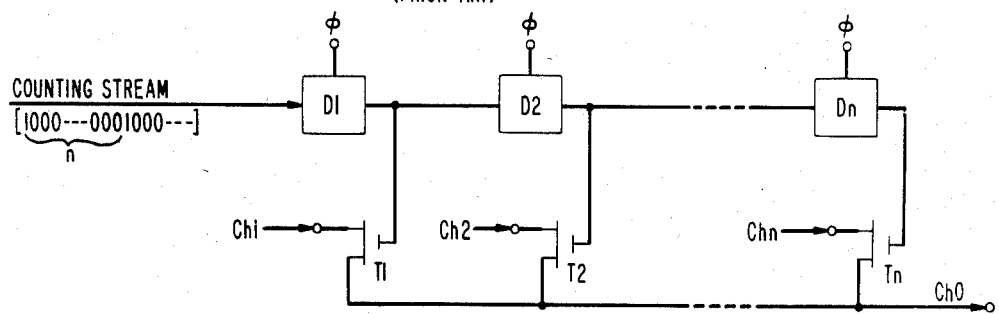
FIG. 3 shows another data multiplexing scheme in accordance with prior art.
Figure 4:
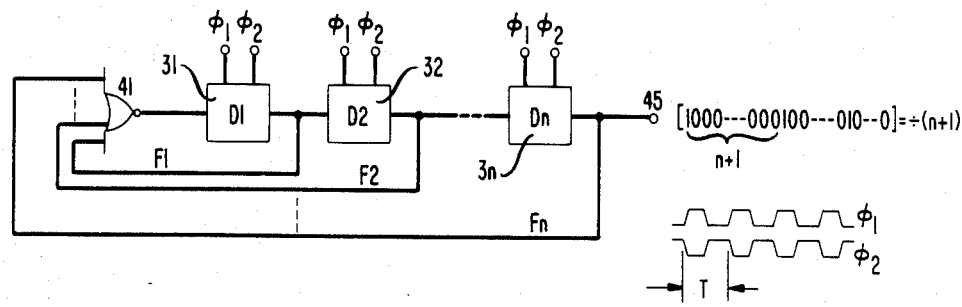
FIG. 4 shows a self-correcting frequency divider in accordance with prior art.

During operation, the NOR gate 51 delivers a zero bit during all clock periods except for every n'th period when the counting stream I delivers a zero bit to the NOR gate, i.e., when I=0. Thus, depending upon whether the (then indeterminate) output Z (and hence also the feedback Fn which is always equal to Z) is then a zero (Z=0) or a one (Z=1), the output Y of the NOR gate during every such n'th period will then be a one (Y=1) or a zero (Y=0), i.e., also indeterminate (denoted by X). On the other hand, every such n'th period, the logic value of the output Z=Fn is inverted by the NOR gate 51, whereby the logic values of the indeterminate bits in the output Z alternate (between X and its inverse X). Thus, regardless of whether the value of X is zero or one, the output Z will be a 2n-bit counting stream, as shown in FIG. 5. This 2n-bit counting stream Z can then be used to control the timing of the 2n-fold multiplexer 60 in similar manner as the n-bit counting to control the timing of the n-fold multiplexer previously described (FIG. 3). It should be understood, of course, that the 2n-bit counting stream Z can also be used to control the timing of a 2n-fold demultiplexer, similarly as previously described in connection with FIG. 2.

The output Z, in the form of a 2n-bit counting stream, is thus equivalent to a divide by 2n(i.e., $\div$2n), that is, a one bit occurs in Z only once during every 2n time slots.

FIG. 6 shows a frequency divider in accordance with a specific embodiment of the invention, to wit, for dividing by 2, 4, 8, etc. Here each box labeled D is a synchronous delay element, such as a master-slave shift register stage whose timing is controlled by a clock pulse sequence $\phi$ and its inverse $\bar{\phi}$. Thus, the delay imposed upon the flow of data through each delay element D is equal to the period of the clock sequence $\phi$. In particular, a delay element 71 is connected for receiving as its input data the output of a first inverter 61 which, in turn, is connected for receiving as its input (feedback) data the output Z1 from the synchronous delay element 71. An input terminal of a first NOR gate 62 is connected for receiving the output Z1 from the delay element 71. An output terminal of the NOR gate 62 is connected to deliver its output to a two-stage shift register formed by a pair of serially-connected synchronous delay elements 81 and 82. In turn, the output Z2 of this two-stage shift register is delivered as feedback to another input terminal of the NOR gate 62 and as input to a second inverter 83.

Similarly, the output terminal of the inverter 83 is connected to an input terminal of a second NOR gate 63 which is connected in a feedback arrangement with a four-stage shift register formed by four serially connected synchronous delay elements 91, 92, 93, and 94. The output Z3 of this four-stage shift register is delivered through at third inverter 95 to a third NOR gate 64 which is connected in a feedback arrangement with an eight-stage shift register formed by 96, etc. (not shown in detail).

During operation, due to feedback to the inverter 61 from the delay element 71, the output Z1 is a 2-bit counting stream, as known in the art. Moreover, the output Z2 is a four-bit counting stream, by analogy to FIG. 5 with n=2. Similarly, the output Z3 is an eight-bit counting stream; and the output Z4 is a sixteen-bit counting stream. Thus, by cascading (in series) the frequency dividers formed by successive shift registers (of increasing number of stages), frequency division by $2^i$, i=any integer, can be achieved (the number of shift register stages in the last cascade being equal to i/2). Notice that the output $\bar{Z2}$ of the inverter 83 is a fourbit counting stream, complementary to Z2; and that the output $\bar{Z3}$ of the inverter 95 is a eight-bit counting stream, complementary to Z3.

FIG. 7 shows another frequency divider (in a cascade arrangement) in accordance with a specific embodiment of the invention, to wit, for dividing by 3, 6, 12, etc., i.e., by $3 \times 2^i$. A first cascade stage comprises a pair of synchronous delay elements 102 and 103 in a double feedback arrangement with a two-input NOR gate 101, whereby the operation divide by 3 is achieved. A second cascade stage comprises three serially connected synchronous delay elements 112, . . . , 114 to form a three-stage shift register. The output ($\div 6$) of this three-stage register is connected in a feedback arrangement to one input terminal of a twoinput NOR gate 111. The output of the first cascade is a three-bit counting stream ($\div 3$). This output is also fed through an inverter 104 to the other input terminal of the NOR gate 111. Similarly, a third cascade stage comprises a six-stage shift register, formed by six serially connected synchronous delay elements 122–127, the output ($\div 12$) of which is connected as feedback to an input terminal of a NOR gate 121 (as well as to an inverter 128 to obtain the complementary $\div 12$ counting stream). The other input terminal of the NOR gate 121 is connected to the output terminal of the inverter 115 in order to receive a six-bit counting stream from the inverter. Thus, frequency division in the form of any counting stream of the form $\div 3 \times 2^i$ (with i an integer greater than 2) can be obtained by cascading such shift registers further, with the number of stages in the last register being equal to $3 \times 2^{i-1}$. Moreover, a square-wave sequence of periodicity equal to 12 bits can be obtained at the drain terminal of an MOS enhancement mode transistor M which has its gate terminal connected to the six-bit counting stream ($\div 6$) and has its source terminal connected to the twelve-bit counting stream ($\div 12$).

Figure 8:
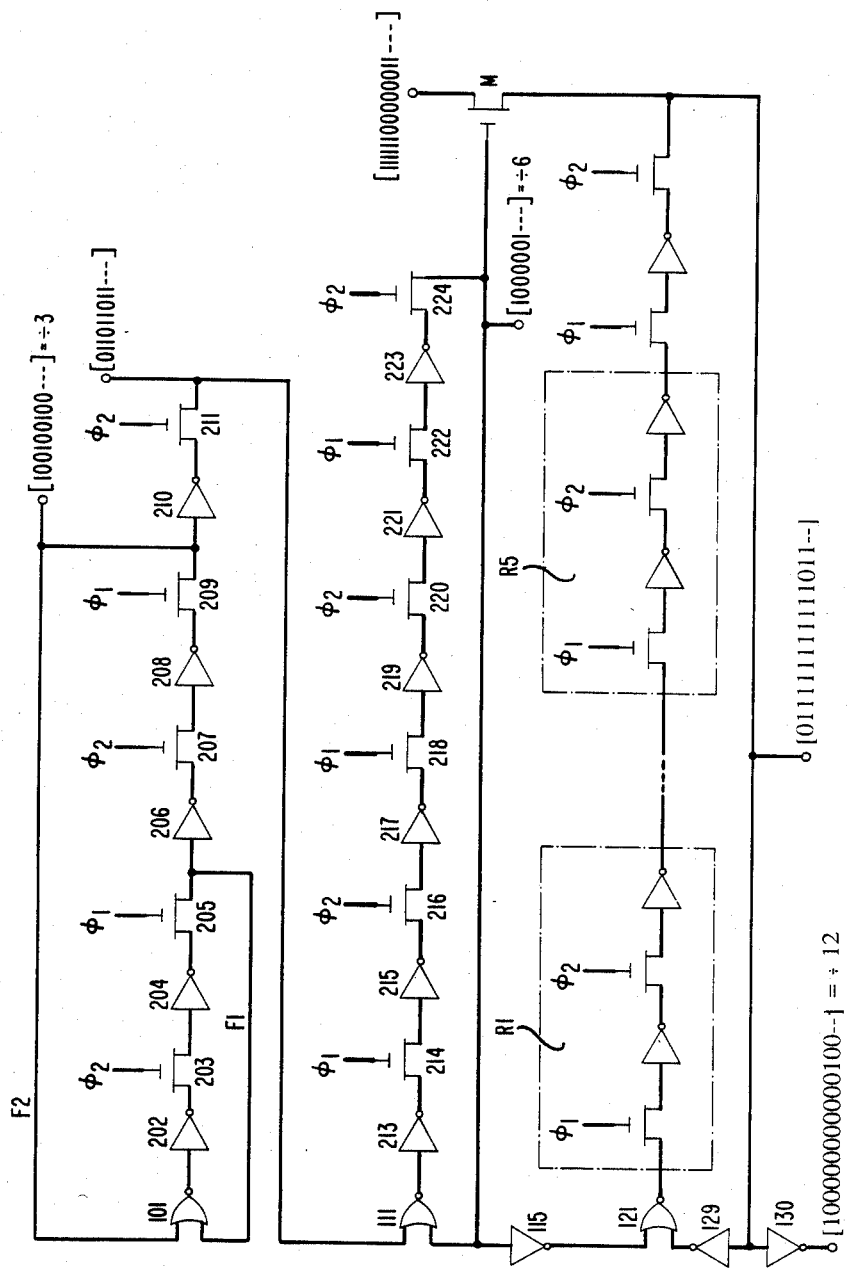

FIG. 8 shows the frequency divider shown in FIG. 7 at the transistor level of the shift registers. Elements in FIG. 8 which are the same as in FIG. 7 are given the same reference numerals. Here (FIG. 8) $\phi_1$ and $\phi_2$ are mutually nonoverlapping two-phase clock pulse sequences, and are ordinarily the same as $\phi$ and $\bar{\phi}$ respectively, except for possible safety margins. Each pair of clocked ($\phi_2 \bar{\phi}_2$) pass transistors together with their two serially connected adjacent inverters forms a separate one of master-slave shift register stages R1, . . . R5. On the other hand, the first cascade stage comprises the NOR gate 101, inverters 202, 204, 206, 208, and clocked pass transistors 203, 205, 207, 209. The output ($\div 3$) thereof is fed through inverter 210 and an extra-clocked pass transistor 211 to the NOR gate 111 of the second cascade stage. Each pass transistor together with an inverter forms a separate dynamic shift register stage, as known in the art. The extra clocked pass transistor 211 is inserted, as shown, between the inverter 210 and the NOR gate 111 in order to avoid the flow of data through three inverters, and hence to avoid a delay of three inverters in succession (counting a NOR gate also as an inverter delay). Note that either of inverters 129 and 130 separately completes a master-slave shift register stage immediately following the stages R1 through R5 in cascade, thereby forming a sixth stage in the cascade. Thus (except for the added clocked pass transistor 211), FIG. 8 is a straightforward dynamic shift register implementation of FIG. 7.

Figure 9:
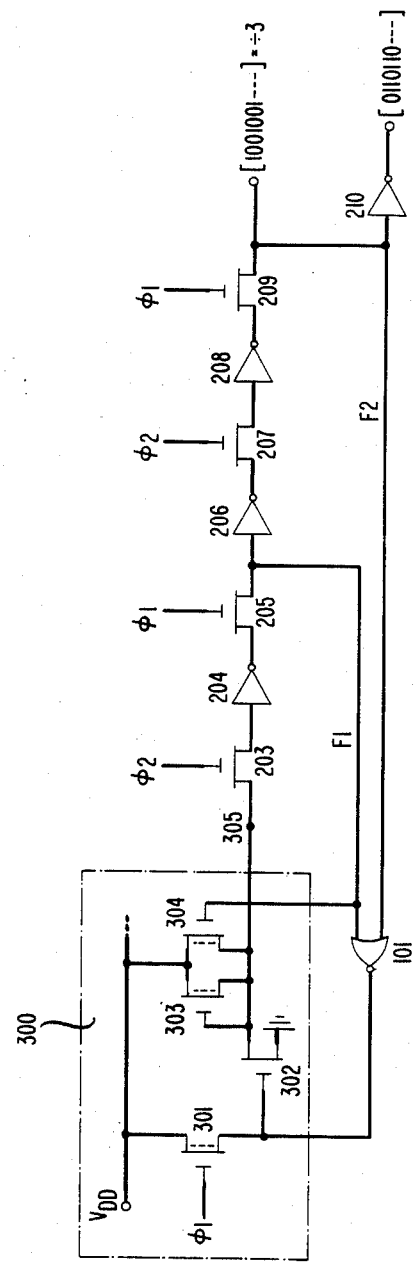

FIG. 9 shows a modified form of the first cascade stage of the frequency divider shown in FIG. 8 at the transistor level of the shift registers. Elements that are the same are denoted by the same reference numerals. Again as in FIG. 8, each shift register stage FIG. 9 is a dynamic master-slave shift register stage formed by a clocked pass transistor in series with an inverter. Between the NOR gate 101 and the clocked pass transistor 203 is connected an anticipatory inverter 300, that is, an inverter which anticipates a (low voltage level) zero bit for the purpose of faster speed of operation as explained below. This inverter 300 has an output terminal 305 and comprises an enhancement mode transistor 302 and depletion mode transistors 301, 303, and 304. The transistor 301 has its source-drain path connected between the output terminal of the NOR gate 101 and a power line $V_{DD}$ (typically +5 volts), and its gate terminal connected to the first clock pulse sequence $\phi_1$. The transistor 302 has one end of its source-drain path connected to ground and the other end through the parallel-connected source-drain paths of transistors 303 and 304 to $V_{DD}$. The gate terminal of transistor 302 is connected to the output terminal of the NOR gate 101; the gate terminal of transistor 303, to its source terminal; and the gate terminal of transistor 304 to the input terminal of the inverter 206.

The purpose of the anticipatory inverter 300 in FIG. 9 is to perform the same inverter-like function as does the (conventional) inverter 202 in FIG. 8 except that the inverter 300 contains added transistors 301 and 304 so that it can operate faster than a conventional inverter (enhancement mode transistor driver in series with depletion mode transistor load), as discussed below. In that discussion it should be remembered that the delay of a transistor acting as a transmission gate or pass transistor is significantly less than an inverter delay.

In FIG. 9, the transistors 302 and 303 are connected and operate together as a conventional inverter. The transistors 301 and 304 are added for faster response time of the inverter and hence for faster speed of operation. These transistors 301 and 304 preferably are zero threshold enhancement, but depletion mode transistors can also be used to avoid the need for extra processing steps. In particular, the added clocked transistor 301 helps to speed up the response of the inverter 300 when the feedback F2 goes from a high to a low voltage level. Specifically, this transistor 301 pulls up the voltage at the output terminal of the NOR gate 101 immediately at the commencement of the first phase of each clock cycle, i.e., when the first phase $\phi_1$ goes high. At most, during (proper) operation, only a single one bit (high voltage level) is present at any time in the feedbacks F1 and F2, and the feedback F1 is in the form of the sequence [010010 . . . ], while the feedback F2 is in the form of the sequence [001001 . . . ]. Thus, when the feedback F2 goes from a high voltage level to a low level (i.e., at a time when the feedback F1 remains low), and hence when the NOR gate 101 should pull up the voltage of its own output terminal, then the clocked transistor 301 starts this pull up immediately upon the commencement of the high phase of the first clock $\phi_1$ and hence the transistor driver 302 starts to turn on and pull down the output terminal 305 of the anticipatory inverter 300, rather than requiring the NOR gate 101 itself to start to pull up the voltage at its output terminal, i.e., rather than waiting for a gate delay time interval of the NOR gate. Notice that, since the feedback F1 remains low during the excursion when F2 goes from high to low, the transistor 304 remains in a relatively low conducting condition throughout the excursion. On the other hand, the added transistor 304 serves to aid in a fast pull up of the output terminal 305 when the feedback F1 goes from a low to a high level—i.e., at a time when the feedback F2 remains low—and hence when the output terminal of the NOR gate 101 should go from high to low and the output terminal 305 of the inverter 300 should go from low to high. Specifically, at the commencement of the first phase of the clock gate when $\phi_1$ goes high, the feedback F1 rather quickly goes high (as limited response time only by the relatively small delay of the transistor 205 acting as a pass transistor) and strongly turns on the added transistor 304, whereby the output terminal 305 receives an early boost in being pulled up without waiting for the response of the NOR gate 101, the delay in the (inverting) NOR gate being significantly greater than the delay in a pass transistor-like transistor 205.

Although the invention has been described in terms of specific embodiments, various modifications can be made without departing from the scope of the invention. For example, instead of dynamic shift register stages which are formed by master-slave dynamic latches, static latches (flip-flops) as known in the art can be used.

Also, instead of the two-input NOR gate 51 (FIG. 5), a two-input NAND gate can be used in conjunction with an input consisting of an n-bit counting stream which is inverted (i.e., complementary) with respect to the stream I (FIG. 5), that is, a stream in which each period of n bits consists of a single one bit followed by (n−1) zero bits instead of the counting stream I shown in FIG. 5.

Note that a two-input NOR gate has the property that when one of its inputs is a one bit the output of the NOR gate is a zero bit regardless of the other input, and when one of its inputs is a zero bit the output of the NOR gate is the inverse of the other input. On the other hand, a two-input NAND gate has the property that when one of its inputs is a one bit the output of the NAND gate is the inverse of the other input, and when one of its input is a zero bit the output of the NAND gate is a one bit regardless of the other input. Thus both the two-input NOR gate and the two-input NAND gate can be viewed as a two-input binary logic gate means for producing an output representing the inverse of one of its inputs whenever the other of its inputs takes on a first binary ditigal logic value and an output representing said first binary digital logic value itself whenever the other of its inputs takes on the inverse of said first binary digital logic value. Accordingly, a frequency divider using the two-input NAND gate (or other two-input logic gate) in accordance with the invention requires no added inverter when the counting stream is of the inverted type.

Similarly, in the embodiment shown in FIG. 6, the two-input NOR gates 62, 63, and 64 can each be replaced by a separate two-input NAND gate, whereby the outputs Z2, Z3 and Z4 will be complementary to those indicated, respectively, in FIG. 6. Likewise, in the embodiment shown in FIG. 7, the NOR gates 101, 111, and 121 can be replaced by NAND gates, in conjunction with connecting the gate electrode of the transistor M to the output terminal (instead of the input terminal) of the inverter 115, and connecting the soruce terminal of transistor M either to the output or to the input terminal of the inverter 128, whereby the square-wave sequence will again be obtained at the drain terminal of transistor M. Moreover, in the embodiment shown in FIG. 8, all two-input NOR gates can be replaced by two-input NAND gates, in conjunction with connecting the gate terminal of the transistor M to the output terminal of the inverter 115, and connecting the source terminal of this transistor M either to the output or to the input terminal of the inverter 129.

Figure 10:
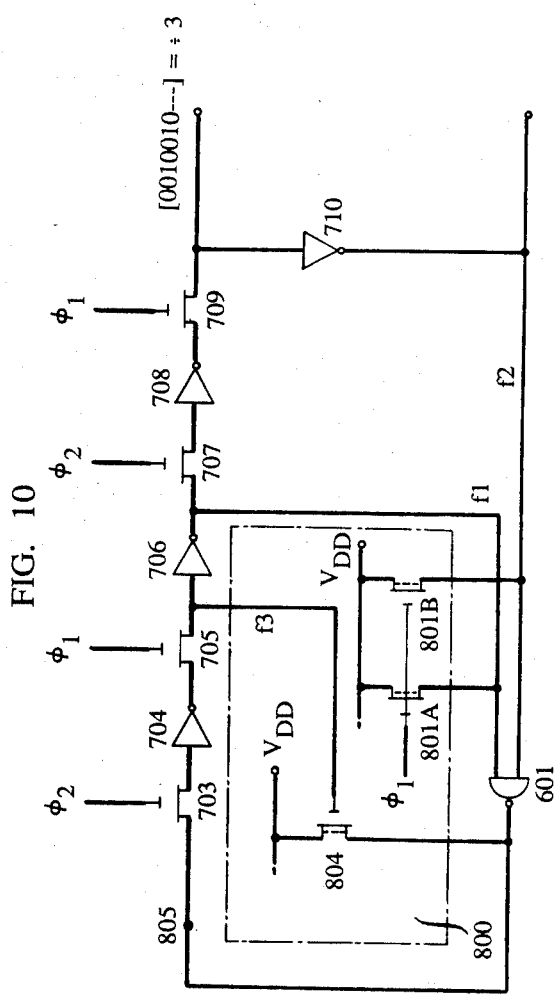

Finally, and as shown in FIG. 10, a frequency divider for performing the same function as the modified form of divider shown in FIG. 9 can be constructed using a NAND gate 601 (instead of the NOR gate 101), together with optional anticipatory circuitry 800 for faster reponse time. Here in FIG. 10, elements that correspond to those of FIG. 9 are denoted by the same respective reference numerals plus five hundred. Also, feedbacks f1, f2 and f3 from the divider are in the form of the sequences [1011011 . . . ], [1101101 . . . ], and [0100100 . . . ], respectively, while the output of the NAND gate 601 developed at node 805 is in the form of the sequence [0110110 . . . ]. Transistors 801A and 801B both are depletion mode or zero threshold enhancement and have their gate electrodes connected to the first clock $\phi_1$ in order to aid the fast pull-up of the inputs to the NAND gate 601 when these inputs go from low to high, in similar manner as the transistor 301 (FIG. 9) aids the fast pull-up of the input to the inverter formed by the transistors 302 and 303 of FIG. 9. On the other hand, in FIG. 10, transistor 804 (depletion mode or zero threshold enhancement) aids a fast pull-up of node 805 when, and only when, the output of the NAND gate 601 is supposed to go from low to high, namely whenever the feedbacks f1 and f2 go from the condition in which both are high to a different condition in which at least one of them is low. Thus, for example, on the commencement of the period corresponding to the transistion from the extreme left-hand (left-most) bit to the next-to-the-left-most bit in the above sequence [0110110 . . . ] developed at the node 805, the corresponding transition in the above sequence representing the feedback f3 is indeed low to high, so that then (and only then during each period of length 3T) the transistor 804 is turned on and thus aids the pull-up of the node 805, as desired.

What is claimed is:

1. In combination:
   (a) a source of an n-bit counting stream of period equal to nT, where n is an integer greater than unity;
   (b) a two-input NOR gate having one of its two input terminals connected for receiving the n-bit counting stream from the source;
   (c) a delay device having n serially connected stages each arranged for delaying bit flow therethrough by an amount of time equal to T, said delay device having its input terminal connected for receiving the output of the NOR gate and its output terminal directly connected to the other input terminal of the NOR gate, whereby the output terminal of the delay device develops a 2n-bit counting stream.

2. A self-correcting frequency divider circuit for converting an input n-bit counting stream into a 4n-bit counting stream comprising first and second cascaded frequency dividing circuits, the first such circuit being a circuit in accordance with claim 1 and the second such circuit also being in accordance with claim 1 except that n is twice as large in the second circuit as in the first circuit.

3. The circuit of claim 1 in which the n-bit counting stream is a three-bit counting stream produced by counting means comprising a counter formed by first and second serially connected dynamic master-slave shift register stages, an output terminal of each of the first and second stages being respectively connected to first and second input terminal of a second NOR gate, the output terminal of the second NOR gate being connected to an input terminal of an anticipatory inverter comprising:
   (a) a clocked first transistor whose source-drain path is connected between a power line and the input terminal of the anticipatory inverter;
   (b) a second transistor whose gate terminal is connected to the output terminal of the second NOR gate and whose source terminal is connected to a reference voltage terminal;
   (c) a third transistor whose source terminal is connected to its gate terminal and to the output terminal of the anticipatory inverter, and whose drain terminal is connected to the power line; and
   (d) a fourth transistor whose gate terminal is connected to the output terminal of the first stage and whose source-drain path is connected between the power line and the output terminal of the anticipatory inverter.

4. In combination:
   (a) a frequency divider circuit in accordance with claim 1; and
   (b) utilization means having 2n input timing control terminals each of which is connected to an output terminal of a different one of the stages.

5. A self-correcting frequency divider circuit for converting an input n-bit counting stream having a periodicity equal to nT into an output 2n-bit counting stream having a periodicity equal to 2nT at a circuitry output terminal, where n is an integer greater than unity, comprising:
   (a) source means for supplying the n-bit counting stream, said stream being a periodic sequence of a single zero bit followed by (n−1) one bits, each bit being valid during a separate time slot of duration T;
   (b) a two-input NOR gate having one of its two input terminals connected to said source means, for receiving the input n-bit counting stream; and
   (c) a delay device for delaying bit flow therethrough by an amount of time equal to said nT having its input terminal directly connected to the output terminal of the NOR gate and its output terminal directly connected both to the other terminal of the NOR gate and to the frequency divider circuit output terminal, whereby the circuit output terminal delivers the output 2n-bit counting in response to the input n-bit counting stream.

6. A frequency divider circuit in accordance with claim 5 in which the delay device has n serially connected stages each arranged for delaying the counting stream by an amount of time equal to T.

7. A self-correcting frequency divider circuit for converting an input n-bit counting stream into a 4n-bit counting stream comprising first and second cascaded frequency dividing circuits, the first such circuit being a circuit in accordance with claim 5 and the second such circuit also being in accordance with claim 5 except the n is twice a large in the second circuit as in the first circuit.

8. The circuit of claim 5 in which the delay device is a serial shift register having n stages, each stage of the register connected for being clocked synchronously with the time slots.

9. The circuit of claim 8 in which the n-bit counting stream is a three-bit counting stream produced by counting means comprising a counter formed by first and second serially connected dynamic master-slave shift register stages, an output terminal of each of the first and second stages being respectively connected to first and secoid input terminals of the NOR gate, the output terminal of the NOR gate being connected to an input terminal of an anticipatory inverter comprising:
   (a) a clocked first transistor whose source-drain path is connected between a power line and the input terminal of the anticipatory inverter;
   (b) a second transistor whose gate terminal is connected to the output terminal of the NOR gate and whose source terminal is connected to a reference voltage terminal;
   (c) a third transistor whose source terminal is connected to its gate terminal and to the output terminal of the anticipatory inverter, and whose drain terminal is connected to the power line; and
   (d) a fourth transistor whose gate terminal is connected to the output terminal of the first stage and whose source-drain path is connected between the power line and the output terminal of the anticipatory inverter.

10. A self-correcting frequency divider circuit for converting an input n-bit counting stream into a 4n-bit counting stream comprising first and second cascaded frequency dividing circuits, the first such circuit being a circuit in accordance with claim 8 and the second such circuit also being in accordance with claim 8 except that n is twice as large in the second circuit as in the first circuit.

11. In combination:
    (a) a frequency divider circuit in accordance with claim 6; and (b) utilization means having 2n input timing control terminals each of which is connected to an output terminal of a different one of the stages.

12. In combination:
(a) a frequency divider circuit in accordance with claim 8; and
(b) utilization means having 2n input timing control terminals each of which is connected to an output terminal of a different one of the stages.

13. A self-correcting frequency divider circuit for converting an input n-bit counting stream having a periodicity equal to nT into an output 2n-bit counting stream having a periodicity equal to 2nT at a circuitry output terminal, where n is an integer greater than unity, comprising:
(a) source means for supplying the n-bit counting stream, said stream being a periodic sequence in which each period thereof consists of a single one bit followed by (n−1) zero bits, each bit being valid during a separate time slot of duration T;
(b) a two-input NAND gate having one of its two input terminals connected to said source means, for recieving the input n-bit counting stream; and
(c) a delay device for delaying bit flow therethrough by an amount of time equal to said nT having its input terminal directly connected to the output terminal of the NAND gate and its output terminal directly connected both to the other input terminal of the NAND gate and to the frequency divider circuit output terminal, whereby the circuit output terminal delivers the output 2n-bit counting stream in response to the input n-bit counting stream.

14. A frequency divider circuit in accordance with claim 13 in which the delay device has n serially connected stages each arranged for delaying the counting stream by an amount of time equal to T.

15. A self-correcting frequency divider circuit for converting an input n-bit counting stream into a 4n-bit counting stream comprising first and second cascaded frequency dividing circuits, the first such circuit being a circuit in accordance with claim 13 and the second such circuit also being in accordance with claim 13 except that n is twice as large in the second circuit as in the first circuit.

16. The circuit of claim 13 in which the delay device is a serial shift register having n stages, each stage of the register connected for being clocked synchronously with the time slots.

17. A self-correcting frequency divider circuit for converting an input n-bit counting stream into a 4n-bit counting stream comprising first and second cascaded frequency dividing circuits, the first such circuit being a circuit in accordance with claim 16 and the second such circuit also being in accordance with claim 16 except than n is twice as large in the second circuit as in the first circuit.

18. A frequency divider circuit according to claim 14 in which the output terminal of the NAND gate is connected to an output terminal of anticipatory circuitry, said anticipatory circuitry comprising a transistor whose source-drain path is connected between a power line and the output terminal of the NAND gate and whose gate terminal is connected to an output terminal of one the stages of the delay device.

19. In combination:

(a) a freqeuncy divider circuit in accordance with claim 14; and
(b) utilization means having 2n input timing control terminals each of which is connected to an output terminal of a different one of the stages.

20. In combination:
(a) a frequency divider circuit in accordance with claim 13; and
(b) utilization means having 2n input timing control terminals each of which is connected to an ouput terminal of a different one of the stages.

21. A self-correcting frequency divider circuit comprising:
(a) a source of an n-bit counting stream of period equal to nT, where n is an integer greater than unity;
(b) a two-input NAND gate having one of its two input terminals connected for receiving the n-bit counting stream from the source;
(c) a delay device having n serially connected stages each arranged for delaying bit flow therethrough by an amount of time equal to T, said delay device having its input terminal connected for receiving the output of the NAND gate and its output terminal directly connected to the other input terminal of the NAND gate, whereby the output terminal of the delay device develops a 2n-bit counting stream.

22. A self-correcting frequency divider circuit for converting an input n-bit counting stream into a 4n-bit counting stream comprising first and second cascaded frequency dividing circuits, the first such circuit being a circuit in accordance with claim 21 and the second such circuit also being in accordance with claim 21 except that n is twice as large in the second circuit as in the first circuit.

23. In combination:
(a) a frequency divider circuit in accordance with claim 21; and
(b) utilization means having 2n input timing control terminals each of which is connected to an output terminal of a different one of the stages.

24. A combination comprising:
(a) a source of an n-bit counting stream of period equal to nT.
(b) two-input logic means for producing an output representative of the inverse of one of its inputs when the other of its inputs has a first binary digital value and for producing an output which is equal to said first binary digital value whenever the other of its inputs is equal to the inverse of the first binary digital value, said logic means having one of its input terminals connected for receiving the n-bit counting stream from the source; and
(c) a delay device having n serially connected stages each arranged for delaying bit flow therethrough by an amount of time equal to T, said delay device having its input terminal connected for receiving the output of the logic means and having its output terminal connected for delivering its output to the other input terminal of the logic means, whereby the output terminal of the delay device devleops a 2n-bit counting stream; and
(d) utilization means connected for receiving the 2n-bit counting stream and adapted for utilizing said 2n-bit counting stream.

* * * * *